(12) United States Patent
Kamakura et al.

(10) Patent No.: US 10,821,543 B2
(45) Date of Patent: Nov. 3, 2020

(54) JOINT MANUFACTURING METHOD

(71) Applicant: NITTO DENKO CORPORATION, Ibaraki-shi, Osaka (JP)

(72) Inventors: Nao Kamakura, Ibaraki (JP); Yuki Sugo, Ibaraki (JP); Satoshi Honda, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 144 days.

(21) Appl. No.: 16/075,260

(22) PCT Filed: Dec. 13, 2016

(86) PCT No.: PCT/JP2016/087074
§ 371 (c)(1),
(2) Date: Aug. 3, 2018

(87) PCT Pub. No.: WO2017/158969
PCT Pub. Date: Sep. 21, 2017

(65) Prior Publication Data
US 2019/0047081 A1 Feb. 14, 2019

(30) Foreign Application Priority Data
Mar. 16, 2016 (JP) ................... 2016-052619

(51) Int. Cl.
*B23K 20/00* (2006.01)
*B23K 20/16* (2006.01)
(Continued)

(52) U.S. Cl.
CPC .............. *B23K 20/16* (2013.01); *B22F 3/14* (2013.01); *B22F 7/08* (2013.01); *B23K 20/026* (2013.01);
(Continued)

(58) Field of Classification Search
CPC .............. B23K 2101/42; B23K 35/025; B23K 1/0008; B23K 20/002; B23K 20/023;
(Continued)

(56) References Cited

U.S. PATENT DOCUMENTS

2009/0020587 A1 1/2009 Shibata et al.
2015/0028085 A1 1/2015 Endoh et al.
(Continued)

FOREIGN PATENT DOCUMENTS

CN 101541466 A 9/2009
CN 105142829 A 12/2015
(Continued)

OTHER PUBLICATIONS

European Patent Office, Office Action Issued in Application No. 16894586.3, dated Nov. 8, 2019, Netherlands, 6 pages.
(Continued)

*Primary Examiner* — Erin B Saad
(74) *Attorney, Agent, or Firm* — Allenman Hall Creasman & Tuttle LLP

(57) ABSTRACT

Provided is a joint manufacturing method including: a step A of preparing a laminate in which two objects to be joined are temporarily adhered with a heat-joining sheet including a pre-sintering layer interposed between the two objects to be joined; a step B of increasing a temperature of the laminate from a temperature equal to or lower than a first temperature defined below to a second temperature; and a step C of holding the temperature of the laminate in a predetermined range after the step B, in which the laminate is pressurized during at least a part of the step B and at least a part of the step C. The first temperature is a temperature at which an organic component contained in the pre-sintering layer is decreased by 10% by weight when the pre-sintering layer is subjected to thermogravimetric measurement.

4 Claims, 3 Drawing Sheets

(51) Int. Cl.

| | | |
|---|---|---|
| *B22F 7/08* | (2006.01) | |
| *B23K 35/36* | (2006.01) | |
| *B23K 35/02* | (2006.01) | |
| *B22F 3/14* | (2006.01) | |
| *B32B 15/00* | (2006.01) | |
| *H01L 23/00* | (2006.01) | |
| *B23K 20/02* | (2006.01) | |
| *B23K 103/00* | (2006.01) | |
| *B23K 35/38* | (2006.01) | |
| *B23K 101/40* | (2006.01) | |
| *B23K 101/36* | (2006.01) | |
| *B32B 5/16* | (2006.01) | |
| *B32B 37/04* | (2006.01) | |
| *B32B 37/06* | (2006.01) | |
| *B32B 37/10* | (2006.01) | |
| *B32B 37/24* | (2006.01) | |

(52) U.S. Cl.
CPC ...... *B23K 35/0222* (2013.01); *B23K 35/0238* (2013.01); *B23K 35/0244* (2013.01); *B23K 35/36* (2013.01); *B23K 35/3612* (2013.01); *B23K 35/3613* (2013.01); *B23K 35/3618* (2013.01); *B32B 15/00* (2013.01); *H01L 24/29* (2013.01); *H01L 24/83* (2013.01); *B22F 2201/01* (2013.01); *B22F 2201/02* (2013.01); *B22F 2201/20* (2013.01); *B22F 2999/00* (2013.01); *B23K 35/38* (2013.01); *B23K 2101/36* (2018.08); *B23K 2101/40* (2018.08); *B23K 2103/56* (2018.08); *B32B 5/16* (2013.01); *B32B 37/04* (2013.01); *B32B 37/06* (2013.01); *B32B 37/1009* (2013.01); *B32B 37/24* (2013.01); *B32B 2305/342* (2013.01); *B32B 2305/80* (2013.01); *B32B 2309/022* (2013.01); *B32B 2309/125* (2013.01); *B32B 2309/68* (2013.01); *B32B 2311/04* (2013.01); *B32B 2311/08* (2013.01); *B32B 2311/12* (2013.01); *B32B 2311/22* (2013.01); *H01L 24/27* (2013.01); *H01L 2224/27436* (2013.01); *H01L 2224/29294* (2013.01); *H01L 2224/29339* (2013.01); *H01L 2224/29344* (2013.01); *H01L 2224/29347* (2013.01); *H01L 2224/32225* (2013.01); *H01L 2224/32227* (2013.01); *H01L 2224/8309* (2013.01); *H01L 2224/83065* (2013.01); *H01L 2224/83075* (2013.01); *H01L 2224/8384* (2013.01); *H01L 2224/83191* (2013.01); *H01L 2224/83204* (2013.01); *H01L 2224/94* (2013.01); *H01L 2224/97* (2013.01)

(58) Field of Classification Search
CPC .... B23K 20/026; B23K 20/16; B23K 20/233; B23K 2101/38; B23K 2103/12; B23K 35/262; B23K 35/3006; B23K 35/3613; B23K 35/3617; B23K 35/362
See application file for complete search history.

(56) References Cited

U.S. PATENT DOCUMENTS

| | | | |
|---|---|---|---|
| 2016/0101486 A1 | | 4/2016 | Endoh et al. |
| 2019/0051807 A1* | | 2/2019 | Okumura ................ H01L 35/08 |

FOREIGN PATENT DOCUMENTS

| | | | |
|---|---|---|---|
| EP | 2645408 | A1 | 10/2013 |
| EP | 3379588 | A1 | 9/2018 |
| JP | 2010248617 | A | 11/2010 |
| JP | 2011080147 | A | 4/2011 |
| JP | 2011095244 | A | 5/2011 |
| JP | 2014029897 | A | 2/2014 |
| JP | 2014111725 | A | 6/2014 |
| JP | 2014214357 | A | 11/2014 |
| JP | 2015057291 | A | 3/2015 |
| JP | 2015232181 | A | 12/2015 |
| JP | 2016015256 | A | 1/2016 |
| WO | 2006126614 | A1 | 11/2006 |
| WO | 2013108408 | A1 | 7/2013 |
| WO | 2015060346 | A1 | 4/2015 |

OTHER PUBLICATIONS

Taiwan Intellectual Property Office, Office Action and Search Report Issued in Application No. 106102503, dated Oct. 4, 2019, 6 pages.
ISA Japan Patent Office, International Search Report Issued in Application No. PCT/JP2016/087074, dated Feb. 21, 2017, 2 pages.
International Bureau of WIPO, International Preliminary Report on Patentability Issued in Application No. PCT/JP2016/087074, dated Sep. 27, 2018, WIPO, 6 pages.
European Patent Office, Extended European Search Report Issued in Application No. 16894586.3, dated Feb. 1, 2019, Germany, 14 pages.
Japan Patent Office, Office Action Issued in Application No. 2016052619, dated Mar. 25, 2020, 6 pages.
China National Intellectual Property Administration, Office Action and Search Report Issued in Application No. 201680083615.2, dated May 6, 2020, 11 pages.

* cited by examiner

- Residual resin or voids
- Unsintered portion
- Sintered portion

JOINT MANUFACTURING METHOD

TECHNICAL FIELD

The present invention relates to a joint manufacturing method.

BACKGROUND ART

Conventionally, there is known a method of joining two objects to be joined using a joining material containing sinterable particles (see, for example, Patent Documents 1 to 3).

Patent Document 1 discloses a method including applying a joining material to one object to be joined (for example, a silicon chip), then disposing the other object to be joined (for example, an oxygen free copper plate) on the surface of the joining material to obtain a laminate, and heating the laminate without pressurizing the laminate, to join the objects to be joined to each other.

Patent Document 2 discloses a method including interposing a joining composition between two objects to be joined, and then heating the objects to be joined to 250° C. while the objects are pressurized, to join the objects to be joined to each other.

Patent Document 3 discloses that a copper chip is first disposed on a copper substrate with a joining material being applied to a lower portion of the copper chip, and the copper chip and the oxygen free copper substrate are then subjected to a preliminary firing step (at 100° C. for 10 minutes in the air atmosphere) and a main firing step (350° C. for 5 minutes) while the copper chip and the oxygen free copper substrate are pressurized with a pressure of 2.5 MPa, to form a joint. Patent Document 3 discloses that the temperature is increased at a temperature increasing rate of 3.0° C./s between the preliminary firing step and the main firing step.

PRIOR ART DOCUMENTS

Patent Documents

PATENT DOCUMENT 1: WO 2013/108408
PATENT DOCUMENT 2: JP-A-2015-57291
PATENT DOCUMENT 3: JP-A-2011-080147

SUMMARY OF THE INVENTION

Problems to be Solved by the Invention

In Patent Document 1, the objects to be joined are joined in a pressureless state. The pressureless joining is a joining method providing less damage to an object to be joined (for example, a chip). However, there is a probability that the volatilization of an organic component and a coating material of sinterable particles (for example, metal particles) contained in a joining material causes insufficient joining at an interface with an object to be joined. Patent Document 1 shows the results of performing a temperature cycle test of 1,000 cycles (each of a high temperature and a low temperature for 5 minutes) in a temperature range of −55° C. to +150° C. However, the test is conducted at 200° C. or lower, and provides no evaluation of joining property at a high temperature of 200° C. or higher.

In Patent Document 2, the objects to be joined are joined while being pressurized. However, the objects to be joined are joined at a high temperature of 250° C. Therefore, a laminate before the joining step is performed is rapidly heated. As a result, there is a probability that an organic component and a coating material of sinterable particles contained in a joining material are rapidly volatilized. The dispersion of the sinterable particles in the joining material is maintained by the organic component. As a result, the rapid heating causes the aggregation of the sinterable particles to occur, which causes a concern that a densely sintered structure is not obtained. This causes a probability that sufficient joining is not obtained.

In Patent Documents 1 and 3, the joining material is a paste-like (liquid-like) material. Accordingly, this requires a coating step and a drying step, and causes a concern that a step time until a joint is obtained is increased.

The present invention has been made in view of the above problems, and it is an object of the present invention to provide a joint manufacturing method that can suppress peeling between a joining material and an object to be joined caused by a volatile matter and that can provide a joint having high joining reliability at a high temperature.

Means for Solving the Problems

In order to solve the above-mentioned conventional problems, the present inventors have studied a joint manufacturing method. As a result, the present inventors have found that the adoption of the following configuration can provide suppression of peeling between a joining material and an object to be joined caused by a volatile matter, can provide a joining material having a densely sintered structure after a sintering step, and can provide a joint having high joining reliability at a high temperature, and the findings have led to the completion of the present invention.

That is, a joint manufacturing method according to the present invention includes:

a step A of preparing a laminate in which two objects to be joined are temporarily adhered with a heat-joining sheet including a pre-sintering layer interposed between the two objects to be joined;

a step B of increasing a temperature of the laminate from a temperature equal to or lower than a first temperature defined below to a second temperature; and a step C of holding the temperature of the laminate in a predetermined range after the step B, in which the laminate is pressurized during at least a part of the step B and during at least a part of the step C.

The first temperature is a temperature at which a weight of an organic component contained in the pre-sintering layer is decreased by 10% by weight when the pre-sintering layer is subjected to thermogravimetric measurement.

When the step B and the step C are performed in air, the thermogravimetric measurement is performed in the air, and when the step B and the step C are performed in a nitrogen atmosphere, a reducing gas atmosphere or a vacuum atmosphere, the thermogravimetric measurement is performed in the nitrogen atmosphere.

According to the above configuration, the temperature of the laminate in which two objects to be joined are temporarily adhered is increased from the temperature equal to or lower than the first temperature to the second temperature (step B). The laminate is pressurized during at least a part of the step B. The first temperature is a temperature at which the organic component contained in the pre-sintering layer is decreased by 10% by weight when the pre-sintering layer is subjected to thermogravimetric measurement. That is, the first temperature is a temperature at which the organic component of the pre-sintering layer (in particular, a low boiling point binder for dispersing sinterable particles) is not rapidly volatilized.

The temperature of the temporarily adhered laminate is increased from the temperature equal to or lower than the first temperature, which does not cause rapid heating. This makes it possible to suppress the rapid volatilization of the organic component and the like contained in a joining material, to prevent peeling. When the joining material contains sinterable particles, the aggregation of the sinterable particles can be prevented. As a result, after the step C, a densely sintered structure can be obtained. Furthermore, the laminate is pressurized during at least a part of the temperature increase, so that the inhibition of the joining caused by a volatile matter to be slightly generated can be suppressed. The generation of coarse voids in a sintered layer can be suppressed.

When the step B and the step C are performed in air, the thermogravimetric measurement is performed in the air, and when the step B and the step C are performed in a nitrogen atmosphere, a reducing gas atmosphere or a vacuum atmosphere, the thermogravimetric measurement is performed in the nitrogen atmosphere.

The atmosphere when the step B and the step C are performed is set according to the objects to be joined, the composition of the heat-joining sheet, or the like. Accordingly, it is required to perform the thermogravimetric measurement under the same conditions as those of the atmosphere when the step B and the step C are performed. Therefore, in the present specification, "when the step B and the step C are performed in air, the thermogravimetric measurement is performed in the air, and when the step B and the step C are performed in a nitrogen atmosphere, a reducing gas atmosphere or a vacuum atmosphere, the thermogravimetric measurement is performed in the nitrogen atmosphere".

For example, when the objects to be joined are made of copper, the objects to be joined are oxidized at a high temperature. Therefore, the step B and step C are performed in a nitrogen atmosphere, a reducing gas atmosphere or a vacuum atmosphere. In this case, the thermogravimetric measurement is performed in the nitrogen atmosphere.

For example, when the heat-joining sheet contains a thermally decomposable binder, the decomposition behavior of the thermally decomposable binder may differ depending on the presence or absence of oxygen and nitrogen and the ratios of oxygen and nitrogen. Since the decomposition behavior varies depending on the presence or absence of oxygen and nitrogen and the ratios of oxygen and nitrogen, the thermogravimetric measurement is performed in the nitrogen atmosphere when the step B and the step C are performed in the nitrogen atmosphere, and the thermogravimetric measurement is performed in the air when the step B and the step C are performed in the air. For example, when an acrylic resin is used as the thermally decomposable binder, the decomposition behavior of the acrylic resin involves the presence or absence of oxygen. Therefore, the step B and the step C are usually performed in the air. In this case, the thermogravimetric measurement is performed in the air. However in the present specification, when equal to or more than a certain joining level is obtained even in the case where the acrylic resin is used as the thermally decomposable binder, the step B and the step C can also be performed in the nitrogen atmosphere. In this case, the thermogravimetric measurement is performed in the nitrogen atmosphere.

For example, when the heat-joining sheet contains copper particles as metal fine particles, the step B and the step C are performed in the nitrogen atmosphere, the reducing gas atmosphere or the vacuum atmosphere (preferably in the nitrogen atmosphere or the reducing gas atmosphere). In this case, the thermogravimetric measurement is performed in the nitrogen atmosphere.

According to the above configuration, after the step B (temperature increasing step), the temperature of the laminate is held in a predetermined range (step C). When the pre-sintering layer contains the sinterable particles, the sinterable particles can be sintered by the step C. This provides strong joining.

In the above configuration, the laminate is preferably pressurized in the range of 5 to 40 MPa.

When the laminate is pressurized at 5 MPa or more, a joint having stronger joining is obtained. When the laminate is pressurized at 40 MPa or less, it is possible to prevent the breakage of an object to be joined (for example, a chip) caused by a load.

In the above configuration, it is preferable that the temperature held in the step C is in the range of 200° C. to 400° C.

When the temperature held in the step C is 200° C. or higher, sintering proceeds satisfactorily, which provides a joint having stronger joining. When the temperature held in the step C is 400° C. or lower, a process time can be shortened, and the damage to the chip caused by heat can be reduced.

It is preferable that the laminate is pressurized by a flip chip bonder or a parallel plate press.

When the laminate is pressurized by the flip chip bonder or the parallel plate press, heating under pressure is easily performed.

MODE FOR CARRYING OUT THE INVENTION

Hereinafter, a joint manufacturing method according to the present embodiment will be described with reference to the drawings. Each of FIGS. 1 to 6 is a schematic cross-sectional diagram for describing a joint manufacturing method according to the present embodiment.

(Joint Manufacturing Method)

A joint manufacturing method according to the present invention includes:

a step A of preparing a laminate in which two objects to be joined are temporarily adhered with a heat-joining sheet including a pre-sintering layer interposed between the two objects to be joined;

a step B of increasing a temperature of the laminate from a temperature equal to or lower than a first temperature defined below to a second temperature; and a step C of holding the temperature of the laminate in a predetermined range after the step B, in which the laminate is pressurized during at least a part of the step B and during at least a part of the step C.

The first temperature is a temperature at which a weight of an organic component contained in the pre-sintering layer is decreased by 10% by weight when the pre-sintering layer is subjected to thermogravimetric measurement.

When the step B and the step C are performed in air, the thermogravimetric measurement is performed in the air, and when the step B and the step C are performed in a nitrogen atmosphere, a reducing gas atmosphere or a vacuum atmosphere, the thermogravimetric measurement is performed in the nitrogen atmosphere.

[Step A]

Figure 1:
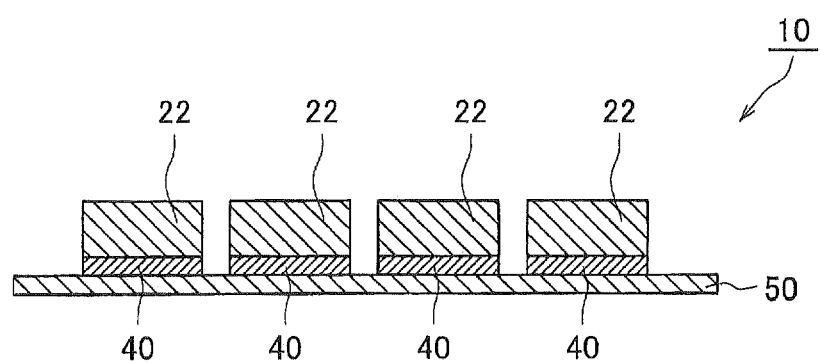
FIG. 1 is a schematic cross-sectional diagram for describing a joint manufacturing method according to the present embodiment.

In the joint manufacturing method according to the present embodiment, first, a laminate 10 shown in FIG. 1 is prepared. The laminate 10 has a structure in which a substrate 50 and a semiconductor element 22 are temporarily adhered with a heat-joining sheet 40 interposed between the substrate 50 and the semiconductor element 22. The substrate 50 and the semiconductor element 22 correspond to objects to be joined in the present invention. Hereinafter, in the present embodiment, the case where the objects to be joined in the present invention are the substrate 50 and the semiconductor element 22 will be described, but as long as the objects to be joined in the present invention can be joined by using the heat-joining sheet, the objects to be joined are not limited to this example.

Hereinafter, a specific method of preparing the laminate 10 will be described.

The laminate 10 can be obtained by the following steps.

A step A-1 of preparing a substrate 50;

a step A-2 of preparing a semiconductor element 22 having one surface on which a heat-joining sheet 40 is stacked; and a step A-3 of temporarily adhering the semiconductor element 22 prepared in the step A-2 to the substrate 50 with a heat-joining sheet 40 interposed between the substrate 50 and the semiconductor element 22.

[Step A-1]

In the step A-1, the substrate 50 (see FIG. 1) is prepared.

A material of the substrate 50 is not particularly limited. For example, the substrate 50 has electrical insulation properties. Specific examples thereof include resins such as polyester resins, epoxy resins, urethane resins, polystyrene resins, polyethylene resins, polyamide resins, polyimide resins, ABS resins, polycarbonate resins, and silicone resins, and ceramics. Among these, a polyimide resin and ceramics are preferable from the viewpoint of heat resistance. Use of resins such as polyimide resin allows the substrate 50 to have flexibility. Use of ceramics allows the substrate 50 to be made strong such that the substrate 50 cannot be bent.

An electrode (not shown) may be formed on a part of a surface of the substrate 50. Examples of the material of the electrode include various metals such as gold, silver, copper, nickel, and cobalt, or various alloys mainly containing these metals. When the semiconductor element 22 is joined to the substrate 50 with the heat-joining sheet 40 interposed between the semiconductor element 22 and the substrate 50 as in the present embodiment, the semiconductor element 22 may be joined to the electrode formed on the substrate 50.

[Step A-2]

In the step A-2, the semiconductor element 22 (FIG. 5) having one surface on which a heat-joining sheet 40 is stacked is prepared.

Here, the heat-joining sheet 40 used in the present embodiment will be described.

(Heat-Joining Sheet)

The heat-joining sheet 40 according to the present embodiment includes one pre-sintering layer. The pre-sintering layer means a layer serving as a sintered layer after predetermined heating.

In the present embodiment, the case where the heat-joining sheet is composed of one pre-sintering layer will be described. However, the heat-joining sheet according to the present invention is not limited to this example as long as it has the pre-sintering layer. The number of the pre-sintering layer is not limited to one, and the pre-sintering layer may be formed of a plurality of layers having different compositions.

The heat-joining sheet of the present invention may be a sheet composed of two or more layers such as the pre-sintering layer and another layer. For example, the heat-joining sheet of the present invention may be a sheet in which a first pre-sintering layer is exposed on one surface and a second pre-sintering layer is exposed on the other surface. Specifically, the heat-joining sheet may be a sheet in which a first pre-sintering layer, another layer, and a second pre-sintering layer are stacked in this order. For example, in this case, the first pre-sintering layer may have the same composition as, or a different composition from that of the second pre-sintered layer.

A thickness of the heat-joining sheet 40 is preferably 30 μm or more, and more preferably 40 μm or more. The thickness of the heat-joining sheet 40 is preferably 100 μm or less, and more preferably 70 μm or less. When the thickness of the heat-joining sheet 40 before being heated is set to the above range, it is possible to maintain a sheet shape.

The pre-sintering layer has a carbon concentration of preferably 15%/o by weight or less, more preferably 12% by weight or less, and still more preferably 10% by weight or less. The carbon concentration is obtained by energy dispersive X-ray spectrometry after being heated from 23° C. to 400° C. in the air atmosphere at a heating rate of 10° C./min. When the carbon concentration is 15% by weight or less, an organic matter is hardly present in the pre-sintering layer heated to 400° C. This provides excellent heat resistance after a sintering step, and high reliability and heat characteristics even in a high-temperature environment.

In the pre-sintering layer, a peak when differential thermal analysis is performed while heating from 23° C. to 500° C. in the air atmosphere at a heating rate of 10° C./min is preferably present at 150 to 350° C., more preferably 170 to 320° C., and still more preferably 180 to 310° C. When the peak is present at 150 to 350° C., an organic matter (for example, a resin component constituting the pre-sintering layer) can be said to be thermally decomposed in this temperature range. This provides more excellent heat resistance after the sintering step.

The pre-sintering layer preferably contains a metal-based compound. Examples of the metal-based compound include Au-based, Ag-based, and Cu-based metal fine particles.

Examples of the metal fine particles include sintering metal particles.

As the sintering metal particles, an aggregate of metal fine particles can be suitably used. Examples of the metal fine particles include fine particles made of a metal. Examples of the metal include gold, silver, copper, silver oxide, and copper oxide. Among these, the metal is preferably at least one selected from the group consisting of silver, copper, silver oxide, and copper oxide. The metal fine particles are made of at least one selected from the group consisting of silver, copper, silver oxide, and copper oxide, which can provide more suitable thermal bonding.

The average particle diameter of the sintering metal particles is preferably 0.0005 μm or more, and more preferably 0.001 μm or more. Examples of the lower limit of the average particle diameter include 0.01 μm, 0.05 μm, and 0.1 μm. On the other hand, the average particle diameter of the sintering metal particles is preferably 30 μm or less, and more preferably 25 μm or less. Examples of the upper limit of the average particle diameter include 20 μm, 15 μm, 10 μm, and 5 μm.

The average particle diameter of the sintering metal particles is measured by the following method. That is, the sintering metal particles are observed by a SEM (scanning electron microscope), to measure an average particle size. During SEM observation, for example, micro-sized sintering metal particles are preferably observed at a magnification of 5,000; submicron-sized sintering metal particles are preferably observed at a magnification of 50,000; and nano-sized sintering metal particles are preferably observed at a magnification of 300,000.

Examples of the shape of the sintering metal particles include a spherical shape, a rod shape, a scale shape, and an infinite shape without particular limitation.

The pre-sintering layer preferably contains metal fine particles in an amount in the range of 60 to 98% by weight relative to the entire pre-sintering layer. The content of the metal fine particles is more preferably in the range of 65 to 97% by weight, and still more preferably in the range of 70 to 95% by weight. When the metal fine particles are contained in the range of 60 to 98% by weight, the metal fine particles can be sintered or melted to bond two objects (for example, a semiconductor element and an electrode).

The pre-sintering layer preferably contains a low-boiling binder. The low-boiling binder is used to facilitate the handling of the metal fine particles. The low-boiling binder is also used to adjust optional mechanical properties. Specifically, the low-boiling binder can be used as a metal fine particles-containing paste in which the metal fine particles are dispersed in the low-boiling binder.

The low-boiling binder is liquid at 23° C. Herein, the term "liquid" includes semiliquid. Specifically, it means that viscosity at 23° C. obtained by viscosity measurement with a dynamic viscoelasticity measuring device (rheometer) is 100,000 Pa's or less.

Conditions for viscosity measurement are as follows.
Rheometer: MARS III manufactured by Thermo SCIENTIFIC
Jig: Parallel plate: 20 mmφ, gap: 100 μm, shear rate: 1/sec)

Specific examples of the low-boiling binder include monohydric and polyhydric alcohols such as pentanol, hexanol, heptanol, octanol, 1-decanol, ethylene glycol, diethylene glycol, propylene glycol, butylene glycol, α-terpineol, 1,6-hexanediol, and isobornyl cyclohexanol (MTPH); ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; and ethylene glycol ethyl ether acetate, ethylene glycol butyl ether acetate, diethylene glycol ethyl ether acetate, diethylene glycol butyl ether acetate, and dipropylene glycol methyl ether acetate (DPMA). These may be used in combination of two or more thereof. Among these, two kinds of low-boiling binders having different boiling points are preferably used in combination. When two kinds of low-boiling binders having different boiling points are used, an excellent sheet shape is maintained.

The pre-sintering layer preferably contains a thermally decomposable binder which is a solid at 23° C. When the pre-sintering layer contains the thermally decomposable binder, the shape of the sheet is likely to be maintained before the sintering step. During the sintering step, the thermally decomposable binder is likely to be thermally decomposed.

Herein, the term "solid" specifically means that viscosity at 23° C. obtained by viscosity measurement with the rheometer is more than 100,000 Pa·s.

Herein, the term "thermally decomposable binder" refers to a binder which can be thermally decomposed in the sintering step. It is preferable that the thermally decomposable binder hardly remains in the sintered layer (the pre-sintering layer after being heated) after the sintering step. Examples of the thermally decomposable binder include a material having a carbon concentration of 15% by weight or less obtained by energy dispersive X-ray spectrometry after being heated from 23° C. to 400° C. in the air atmosphere at a heating rate of 10° C./min even if the pre-sintering layer contains the material. For example, by adopting a material which is more likely to be thermally decomposed as the thermally decomposable binder, the material is allowed to hardly remain in the sintered layer (the pre-sintering layer after being heated) after the sintering step even if the content of the material is comparatively increased.

Examples of the thermally decomposable binder include polycarbonate, an acrylic resin, ethylcellulose, and polyvinyl alcohol. These materials can be used singly or in combination of two or more. Among these, from the viewpoint of high thermal decomposability, polycarbonate is preferable.

The polycarbonate is not particularly limited as long as the polycarbonate can be thermally decomposed in the sintering step. Examples of the polycarbonate include aliphatic polycarbonate containing an aliphatic chain without containing an aromatic compound (for example, a benzene ring or the like) between ester carbonate groups (—O—CO—O—) as a main chain, and aromatic polycarbonate containing an aromatic compound between ester carbonate groups (—O—CO—O—) as a main chain. Among these, aliphatic polycarbonate is preferred.

Examples of the aliphatic polycarbonate include polyethylene carbonate and polypropylene carbonate. Among these, polypropylene carbonate is preferred from the viewpoint of solubility in an organic solvent when a varnish for forming a sheet is produced.

Examples of the aromatic polycarbonate include those having a bisphenol A structure as a main chain.

The weight average molecular weight of the polycarbonate is suitably in a range of 10,000 to 1,000,000. The weight average molecular weight is a value that is measured by GPC (gel permeation chromatography) and calculated in terms of polystyrene.

Examples of the acrylic resin include a polymer (acrylic copolymer) containing, as a component or components, one or more esters of acrylic acid or methacrylic acid having a linear or branched alkyl group having 30 or less carbon atoms, in particular, 4 to 18 carbon atoms in a range in which the acrylic resin can be thermally decomposed in the sintering step. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a dodecyl group.

Other monomers that form the polymer (acrylic copolymer) are not especially limited, and examples thereof include carboxyl group-containing monomers such as acrylic acid, methacrylic acid, carboxyethyl acrylate, carboxypentyl acrylate, itaconic acid, maleic acid, fumaric acid, and crotonic acid, acid anhydride monomers such as maleic anhydride and itaconic anhydride, hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and (4-hydroxymethylcyclohexyl)-methylacrylate, sulfonic acid group-containing monomers such as styrene sulfonate, allyl sulfonate, 2-(meth)acrylamide-2-methylpropane sulfonic acid, (meth)acrylamidepropane sulfonic acid, sulfopropyl(meth)acrylate, and (meth)acryloyloxynaphthalene sulfonic acid, and phosphate group-containing monomers such as 2-hydroyethylacryloyl phosphate.

Among the acrylic resins, those more preferably have a weight average molecular weight of 10,000 to 1,000,000, and still more preferably 30,000 to 700,000. When the weight average molecular weight is in the above range, adhesion before the sintering step and thermal decomposition property during the sintering step become excellent. The weight average molecular weight is a value that is measured by GPC (gel permeation chromatography) and calculated in terms of polystyrene.

Among the acrylic resins, an acrylic resin thermally decomposed at 200° C. to 400° C. is preferred.

The pre-sintering layer may appropriately contain, other than the above-mentioned components, a plasticizer or the like, for example.

The heat-joining sheet 40 can be manufactured by an ordinary method. For example, a varnish containing the respective components for forming the heat-joining sheet 40 is produced. The varnish is applied onto a substrate separator to form a coating film so as to have a predetermined thickness, the coating film is then dried, and the heat-joining sheet 40 is thereby manufactured.

A solvent that is used in the varnish is not particularly limited. However, an organic solvent or an alcoholic solvent is preferred which allows each of the above-described components to be dissolved, kneaded, or dispersed, uniformly. Examples of the organic solvent include ketone-based solvents such as dimethylformamide, dimethylacetamide, N-methylpyrrolidone, acetone, methylethylketone, and cyclohexanone; toluene; and xylene. Examples of the alcoholic solvent include ethylene glycol, diethylene glycol, 1,2-propanediol, 1,3-propanediol, 1,2-butanediol, 1,3-butanediol, 1,4-butanediol, 2-butene-1,4-diol, 1,2,6-hexanetriol, glycerin, octanediol, 2-methyl-2,4-pentanediol, and terpineol.

The applying method is not particularly limited. Examples of methods for coating a solvent include a die coater, a gravure coater, a roll coater, a reverse coater, a comma coater, a pipe doctor coater, and screen printing. Among these, a die coater is preferred in terms of high uniformity in an application thickness. The drying condition of the coating film is not particularly limited. For example, drying can be performed at a drying temperature of 70° C. to 160° C. for a drying time of 1 minute to 5 minutes. Even after the coating film is dried, some solvents may remain in the coating film without the solvents being wholly evaporated.

When the pre-sintering layer contains the low-boiling binder, a part of the low-boiling binder may be volatilized depending on the drying condition. Therefore, the ratios of the respective components constituting the pre-sintering layer vary according to the drying condition. For example, even in the pre-sintering layer formed of the same varnish, the content of the metal fine particles in the entire pre-sintering layer and the content of the thermally decomposable binder are increased as a drying temperature is higher and a drying time is longer. Therefore, the drying condition is preferably set so that the metal fine particles and the thermally decomposable binder are contained in desired amounts in the pre-sintering layer.

Polyethylene terephthalate (PET), polyethylene, polypropylene, and a plastic film or a paper or the like whose surface is coated with a peeling agent such as a fluorine based peeling agent and a long chain alkylacrylate based peeling agent can be used as the substrate separator.

As a method of manufacturing the heat-joining sheet 40, for example, a method is also suitable which includes mixing the components for forming the pre-sintering layer in a mixer to obtain a mixture and press-forming the mixture to manufacture the heat-joining sheet 40. Examples of the mixer include a planetary mixer.

The heat-joining sheet 40 is preferably sandwiched between two separators. That is, the heat-joining sheet 40 is preferably sandwiched between two separators such that a separator 40a, the heat-joining sheet 40, and a separator 40b are stacked in this order (see FIG. 4). As the separator 40a and the separator 40b, the same separator as the substrate separator can be used.

The heat-joining sheet 40 has been described above.

In the step A-2, as described above, the semiconductor element 22 having one surface on which the heat-joining sheet 40 is stacked (see FIG. 5) is prepared.

The semiconductor element 22 having one surface on which the heat-joining sheet 40 is stacked can be obtained by the following step X and step Y.

A step X of forming the heat-joining sheet 40 on one surface of a semiconductor wafer 20; and a step Y of making the semiconductor wafer 20 on which the heat-joining sheet 40 formed in the step X is formed into individual pieces.

[Step X]

Figure 2:
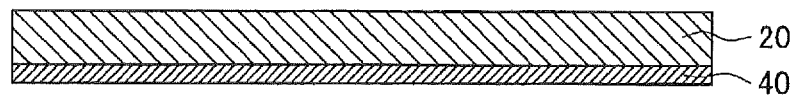
FIG. 2 is a schematic cross-sectional diagram for describing a joint manufacturing method according to the present embodiment.

In the step X, as shown in FIG. 2, the heat-joining sheet 40 is formed on one surface of the semiconductor wafer 20. In this step, the heat-joining sheet 40 is pasted to the semiconductor wafer 20.

Figure 3:
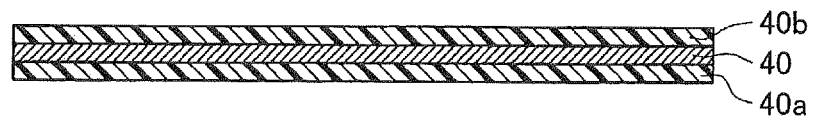
FIG. 3 is a schematic cross-sectional diagram for describing a joint manufacturing method according to the present embodiment.

The heat-joining sheet 40 is usually prepared in a state where a separator is pasted to each of both surfaces of the heat-joining sheet 40. FIG. 3 shows a state where separators (separator 40a, separator 40b) are pasted to both surfaces of the heat-joining sheet 40.

When the heat-joining sheet 40 is pasted to the semiconductor wafer 20, one of the separators is peeled off, and the heat-joining sheet 40 is then pasted.

Figure 4:
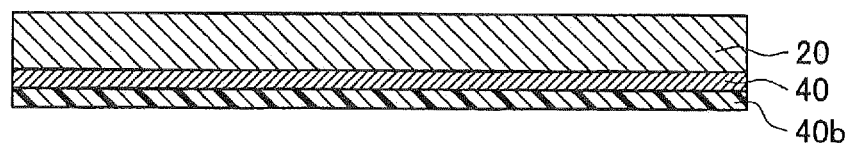
FIG. 4 is a schematic cross-sectional diagram for describing a joint manufacturing method according to the present embodiment.

More specifically, as shown in FIG. 4, first, the semiconductor wafer 20 is placed on the heat-joining sheet 40 from which the separator 40a has been peeled off. Then, the semiconductor wafer 20 is pasted under pressure. The semiconductor wafer 20 can be pasted by, for example, a laminator or a flat plate press. It is preferable that a pasting pressure is in the range of 0.01 to 10 MPa. A pasting temperature during pasting is not particularly limited, and it is preferably in the range of 23 to 90° C., for example.

[Step Y]

Figure 5:
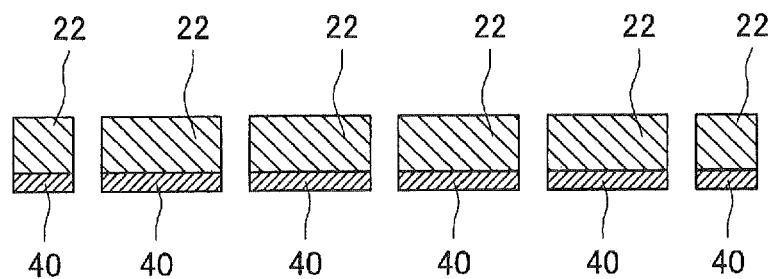
FIG. 5 is a schematic cross-sectional diagram for describing a joint manufacturing method according to the present embodiment.

In the step Y, as shown in FIG. 5, the semiconductor wafer 20 obtained in the step X and including the heat-joining sheet 40 formed thereon is made into individual pieces.

Specifically, the separator 40b is peeled off from the heat-joining sheet 40, and pasted on a dicing tape (not shown). The semiconductor wafer 20 is then diced into individual pieces.

As the dicing tape, a conventionally known dicing tape can be adopted, and therefore the description thereof will be omitted. As a dicing method, a conventionally known method can be adopted using a conventionally known dicing device, and therefore the description thereof will be omitted. Examples thereof include a method using a dicing blade, and a method of splitting after laser irradiation.

As described above, the semiconductor element 22 having one surface on which the heat-joining sheet 40 is stacked is obtained.

In the above embodiment, the case where the separator 40b is peeled off before dicing has been described. However, the timing of peeling off the separator 40b is not limited to this example. For example, the separator 40b may be peeled off after dicing. However, the case where the separator 40b is peeled off before dicing is excellent in that the separator 40b can be collectively peeled off before the semiconductor wafer 20 is made into individual pieces. The case where the separator 40b is peeled off after dicing is excellent in that the heat-joining sheet 40 can be protected just before temporary adhesion.

[Step A-3]

In the step A-3, the semiconductor element 22 prepared in the step A-2 is temporarily adhered to the substrate 50 with the heat-joining sheet 40 interposed between the semiconductor element 22 and the substrate 50 (see FIG. 1). In this step, a plurality of the semiconductor elements 22 are temporarily adhered onto the substrate 50 using a chip mounter and the like. As a temporary adhesion condition, temporary adhesion is preferably performed under a pressure of 0.01 MPa to 5 MPa. A temperature during temporary adhesion is not particularly limited, and it is preferably in the range of 23 to 150° C., for example. A pressure time is preferably 0.01 to 5 seconds.

The method of obtaining the laminate 10 (step A) has been described above.

One embodiment of the step A of preparing the laminate has been described above. However, the step A of preparing the laminate according to the present invention is not limited to the above embodiment as long as the laminate can be prepared. For example, the laminate may be prepared by the following steps.

A step A-11 of preparing a first object to be joined (for example, a substrate) having one surface on which a heat-joining sheet is stacked;

a step A-12 of preparing a second object to be joined (for example, a semiconductor element); and a step A-13 of temporarily adhering the second object to be joined prepared in the step A-12 to the first object to be joined with the heat-joining sheet interposed between the second object to be joined and the first object to be joined.

A step A-21 of preparing a first object to be joined (for example, a substrate);

a step A-22 of preparing a second object to be joined (for example, a semiconductor element); and a step A-23 of disposing a heat-joining sheet between the first object to be joined prepared in the step A-21 and the second object to be joined prepared in the step A-22, and temporarily adhering the first object to be joined and the second object to be joined to each other (temporarily adhering the first object to be joined and the second object to be joined to the heat-joining sheet simultaneously).

After the step A, a temperature of the laminate 10 is increased from a temperature equal to or lower than a first temperature defined below to a second temperature.

The first temperature is a temperature at which an organic component contained in the pre-sintering layer is decreased by 10% by weight when the pre-sintering layer is subjected to thermogravimetric measurement.

When the step B and the step C are performed in air, the thermogravimetric measurement is performed in the air, and when the step B and the step C are performed in a nitrogen atmosphere, a reducing gas atmosphere or a vacuum atmosphere, the thermogravimetric measurement is performed in the nitrogen atmosphere.

Figure 6:
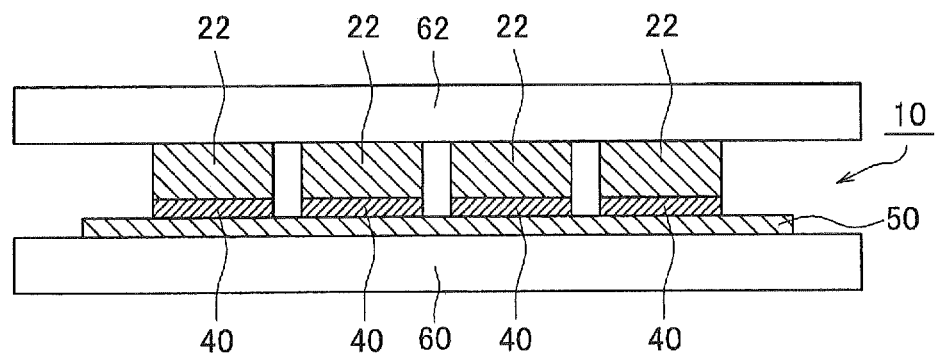
FIG. 6 is a schematic cross-sectional diagram for describing a joint manufacturing method according to the present embodiment.

In the present embodiment, as shown in FIG. 6, the case where the step B and a step C to be described below are performed using a parallel plate press including a lower heating pressurizing plate 60 and an upper heating pressurizing plate 62 will be described. The lower heating pressurizing plate 60 and the upper heating pressurizing plate 62 are pressurizing plates each including a heater inside the plate. As in the present embodiment, when the pressurizing device (the lower heating pressurizing plate 60, the upper heating pressurizing plate 62) also has a heating function, the phrase "a temperature of the laminate is increased from a temperature equal to or lower than a first temperature to a second temperature" means that a temperature of at least one of the lower heating pressurizing plate 60 and the upper heating pressurizing plate 62 as the pressurizing device is increased from the temperature equal to or lower than the first temperature to the second temperature.

The first temperature is a temperature at which a weight of the organic component contained in the pre-sintering layer is decreased by 10% by weight when the pre-sintering layer is subjected to thermogravimetric measurement. That is, the first temperature is a temperature at which the organic component contained in the pre-sintering layer is decreased by 10% by weight when the whole weight of the organic component is 100% by weight. For example, when the weight of the organic component contained in the pre-sintering layer is 5% by weight of the whole weight of the pre-sintering layer, the first temperature means a temperature at which the organic component is decreased by 10% by weight of 5% by weight (0.5% by weight based on the whole weight of the pre-sintering layer).

"The organic component contained in the pre-sintering layer" includes the thermally decomposable binder and the low boiling point binder. The organic component does not include the metal fine particles (for example, sinterable metal particles). The first temperature is a temperature to be set for the purpose of mainly preventing the rapid volatilization of the low boiling point binder. The first temperature is a temperature at which the thermally decomposable binder is presumed to be hardly decomposed.

The thermogravimetric measurement is performed by using the pre-sintering layer. The thermogravimetric measurement is not measurement performed by extracting only the organic component. The reason why the thermogravimetric measurement is performed by using the pre-sintering layer is that the mixing of the organic component and the metal fine particles may cause the boiling point of the low boiling point binder and the decomposition temperature of the thermally decomposable binder to be different from those when the boiling point and the decomposition temperature are measured by themselves.

The first temperature varies depending on the composition of the pre-sintering layer, and examples thereof include 50° C., 80° C., and 100° C.

In this step B (temperature increasing step), the lower heating pressurizing plate 60 and the upper heating pressurizing plate 62 are preheated to the first temperature, and the laminate 10 is then sandwiched between the lower heating pressurizing plate 60 and the upper heating pressurizing plate 62. Thereafter, the temperature is increased to the second temperature at a predetermined temperature increasing rate. However, in the present invention, the temperature may be increased from the temperature equal to or lower than the first temperature to the second temperature without preheating the laminate 10 to the first temperature. For example, the laminate 10 may be sandwiched between the lower heating pressurizing plate 60 and the upper heating pressurizing plate 62 in a state where the lower heating pressurizing plate 60 and the upper heating pressurizing plate 62 are not preheated (in a state where the temperature is equal to or lower than the first temperature), thereafter, the temperature is increased to the second temperature at a predetermined temperature increasing rate.

The temperature increasing rate is preferably 0.1° C./s or more, more preferably 0.5° C./s or more, and still more preferably 1° C./s or more. The temperature increasing rate is preferably 5° C./s or less, more preferably 3° C./s or less, and still more preferably 2° C./s or less. When the temperature increasing rate is 2° C./s or less, raid heating can be further suppressed. On the other hand, when the temperature increasing rate is 0.1° C./s or more, the process can be shortened.

The second temperature is a temperature at the start of the step C (sintering step), and is a temperature at which sintering substantially starts.

The second temperature varies depending on the composition of the pre-sintering layer, and examples thereof include 200° C., 250° C., and 300° C.

In the present embodiment, the laminate 10 is constantly pressurized while the temperature of the laminate 10 is increased from the temperature equal to or lower than the first temperature to the second temperature. The laminate 10 is pressurized at preferably in the range of 5 to 40 MPa, and more preferably in the range of 5 to 15 MPa. When the laminate 10 is pressurized at 5 MPa or more, a joint having stronger joining is obtained. When the laminate 10 is pressurized at 40 MPa or less, the load on the chip can be reduced. The pressurization may be pressurization with certain pressure, or pressurization while changing pressure in a certain range.

In the present embodiment, the case where the laminate 10 is constantly pressurized while the temperature of the laminate 10 is increased from the temperature equal to or lower than the first temperature to the second temperature has been described. However, the present invention is not limited to this example, and the laminate 10 may be pressurized during at least a part of the step B. This is because when the laminate 10 is pressurized during at least a part of the step B, more suitable joining is obtained. For example, the temperature increase may be started from the temperature equal to or lower than the first temperature without pressurizing, and the pressurization may be started before the temperature reaches the second temperature after the lapse of a certain period of time.

[Step C]

After the step B, the temperature of the laminate 10 is held in a predetermined range.

In this joining step C (joining step), the metal fine particles in the heat-joining sheet 40 are sintered by heating, and the thermally decomposable binder is thermally decomposed as necessary. The residual low boiling point binder which has not been volatilized by the drying step when the heat-joining sheet 40 is manufactured is volatilized.

The step C is performed subsequent to the step B while the laminate 10 is pressurized by the lower heating pressurizing plate 60 and the upper heating pressurizing plate 62.

It is preferable that the temperature (temperature held in the step C) is equal to or higher than the second temperature. Specifically, the temperature is preferably in the range of 200° C. to 400° C., and more preferably in the range of 250° C. to 300° C. When the temperature held in the step C is 200° C. or higher, sintering proceeds satisfactorily, which provides a joint having stronger joining. When the temperature held in the step C is 400° C. or lower, a process time can be shortened, and the damage to the chip caused by heat can be reduced.

In the present embodiment, the laminate 10 is constantly pressurized during the step C. The laminate 10 is pressurized at preferably in the range of 5 to 40 MPa, and more preferably in the range of 5 to 15 MPa. When the laminate 10 is pressurized at 5 MPa or more, a joint having stronger joining is obtained. When the laminate 10 is pressurized at 40 MPa or less, the load on the chip can be reduced. The pressurization may be pressurization with certain pressure, or pressurization while changing pressure in a certain range (for example, in the numerical range above).

In the present embodiment, the case where the laminate 10 is constantly pressurized during the step C has been described. However, the present invention is not limited to this example, and the laminate 10 may be pressurized during at least a part of the step C. This is because when the laminate 10 is pressurized during at least a part of the step C, more suitable joining is obtained. For example, the laminate 10 may be pressurized immediately after the start of the step C, and the pressurization may be stopped before the completion of the step C after the lapse of a certain period of time (while keeping the temperature in a predetermined range).

The step C is performed for 30 seconds or more and 600 seconds or less, preferably for 90 seconds or more and 480 seconds or less, and more preferably for 150 seconds or more and 300 seconds or less. When the step C is performed in the above numerical range, a suitable joint is obtained.

In the present embodiment, the case where the step C is continuously performed after the step B has been described. However, the present invention is not limited to this example, and other steps may be provided before the step C and after the step B. For example, after the step B, the laminate 10 may be cooled to the temperature equal to or lower than the second temperature once, the laminate 10 is then heated again or the like, followed by performing the step C. However, it is preferable that the step C is continuously performed after the step B.

In the present embodiment, the case where the pressurization is performed in the step B and the step C by the parallel plate press has been described. However, the present invention is not limited to this example, and the pressurization may be performed by a device such as a flip chip bonder that can simultaneously perform heating and pressurization. The laminate may be pressurized by disposing the laminate in a pressure-resistant container, and filling the container with air or nitrogen and the like to increase the pressure. In this case, the first temperature and the second temperature mean temperatures in the pressure-resistant container.

[Cooling Step]

Thereafter, as necessary, a cooling step may be performed. Examples of the cooling step may include air cooling and water cooling. Only one or both thereof may be performed. By appropriately performing the cooling step, the manufacturing period can be shortened. In the present embodiment, after the step C (sintering step), air cooling is performed until the temperature reaches a third temperature, and water cooling is then performed. The third temperature is lower than the second temperature, and can be appropriately set in the range of 125 to 200° C., for example. When air cooling is first performed and water cooling is then performed, cooling can be efficiently performed. Examples of the water cooling include a method in which water is circulated in a heating pressurizing plate in a state where a laminate is held by the heating pressurizing plate, to cool the heating pressurizing plate, thereby cooling the laminate. As a result, the laminate can be cooled to room temperature (for example, 23° C.). However, the cooling step is not limited to this example, and water cooling may be performed from the same temperature as the second temperature.

Thus, a joint is obtained.

The joint manufacturing method according to the present embodiment has been described above.

In the above-described embodiment, the case where the heat-joining sheet is provided as a single body has been described. However, the heat-joining sheet according to the present invention is not limited to this example. For example, the heat-joining sheet may be provided as a heat-joining sheet with a dicing tape stacked on a dicing sheet.

EXAMPLES

Hereinafter, the present invention will be described in detail by way of examples. However, the present invention is not limited to the examples below as long as the present invention does not exceed the gist thereof.

Components used in examples will be described.

Metal fine particles-containing paste A: obtained by appropriately adjusting the amount of a low-boiling binder contained in ANP-1 (paste in which nano-sized fine silver particles are dispersed in the low-boiling binder) manufactured by Applied Nanoparticle Laboratory Corporation Thermally decomposable binder A (polypropylene carbonate resin): QPAC 40 manufactured by Empower Materials Inc., solid at 23° C.

Organic solvent A: Methyl ethyl ketone (MEK)

[Preparation of Heat-Joining Sheet]

100 parts by weight of a metal fine particle-containing paste A, 1 part by weight of a thermally decomposable binder A, and 70 parts by weight of an organic solvent A were blended. Next, a varnish was prepared by stirring the blended product at 2000 rpm for 8 minutes using a rotation/revolution mixer (ARE-310 manufactured by THINKY CORPORATION).

The obtained varnish was applied onto a released-treated film (MRA38 manufactured by Mitsubishi Plastics, Inc.), followed by drying. The varnish was applied by using an applicator so that a coating film after drying had a thickness of 45 μm. The drying was performed in an explosion-proof dryer. The drying was performed at 110° C. for 3 minutes. Thus, a heat-joining sheet having a thickness of 45 μm was obtained.

[Measurement of 10% Weight Loss Temperature of Organic Component by Thermogravimetric Measurement Method (TG-DTA)]

TG 8120 manufactured by Rigaku was used for measuring the 10% weight loss temperature of the organic component by the thermogravimetric measurement method. 10 mg of the heat-joining sheet (pre-sintering layer) as a sample was placed in an aluminum container, and subjected to a weight change measurement in the temperature range of 25° C. to 500° C. at a temperature increasing rate of 10° C./min in the air atmosphere. As a result, the 10% weight loss temperature of the organic component was 125° C.

[Reliability Evaluation]

A silicon chip (thickness: 350 μm, length: 5 mm, width: 5 mm) was prepared, in which a Ti layer (thickness: 50 nm) and an Ag layer (thickness: 100 nm) were formed in this order on a back surface. The prepared heat-joining sheet was superposed on the Ag layer surface of the prepared silicon chip, to obtain a stacked product. In this state, the stacked product was allowed to pass through a laminator. The laminator conditions of a temperature of 70° C., a pressure of 0.3 MPa, and a speed of 10 mm/sec were set.

A copper plate (thickness: 3 mm) entirely covered with an Ag layer (thickness: 5 μm) was prepared. The heat-joining sheet with a silicon chip (prepared as above) was temporarily adhered on the prepared copper plate. The pressure during the temporary adhesion is 0.1 MPa. During the temporary adhesion, the copper plate was previously heated to 70° C.

Joining was performed under heating conditions (pressurizing pressure, temperature increase starting temperature, temperature increasing time, sintering temperature, sintering time) as described in Table 1. These were used as Examples 1 to 7 and Comparative Examples 1 and 2. In examples and comparative examples, heat-joining sheets with the same copper plate and the same silicon chip are used, and only the heating conditions are different. Pressurization was performed by a flat plate press, and constantly performed during the temperature increasing step and the sintering step. The atmosphere during the temperature increase and the sintering was the air atmosphere.

After the heating (after the completion of the sintering step), air cooling was performed until the temperature reached 170° C., and water cooling was then performed until the temperature reached 80° C. The water-cooling is provided by a water-cooling type cooling plate provided in a pressurizing plate. Thus, a sample for evaluation was obtained. For the joining, a sintering device (HTM-3000 manufactured by Hakuto Co., Ltd.) was used.

Next, the sample for evaluation was charged into a heat/cold shock testing machine (TSE-103ES manufactured by ESPEC CORPORATION), and subjected to heat/cold shock of −40° C. to 200° C. for 100 cycles. At this time, the sample was held at −40° C. for 15 minute and 200° C. for 15 minutes.

After 100 cycles, an image was taken using an ultrasonic imaging device [SAT] (FineSAT II manufactured by Hitachi Kenki FineTech Co., Ltd.), to confirm a portion where the silicon chip and the copper plate were joined by the sintered layer. A transducer (probe) used is PQ-50-13: WD [frequency: 50 MHz]. The shooting mode is "reflection".

Using image analysis software Image J, the area (residual area) of a portion where joining remained in the obtained image was determined, and the ratio of the residual area to the total area (residual joining area ratio) was calculated.

The case where the residual joining area ratio was 60% or more was evaluated as good, and the case where the residual joining area ratio was lower than 60% was evaluated as poor. The results are shown in Table 1. In the image obtained by the ultrasonic imaging device, a portion where the silicon chip and the substrate are peeled off looks white, and a portion where the joining remains looks gray.

<Precise Polishing Conditions>
Waterproof abrasive paper: SiC Foil #220, #1000 manufactured by Struers
Disk rotation number: 100 rpm
Load: 200 to 500 g Then, the vicinity of the center of the exposed surface was ion-polished. As the device, a cross section polisher SM-09010 manufactured by JEOL Ltd. was used, and the conditions of ion polishing were as follows.

<Ion Polishing Conditions>
Acceleration voltage: 5 to 6 kV
Processing time: 8 to 10 hours
Amount of protrusion from shielding plate: 25 to 50 μm The cross-sectional SEM image (image by scanning electron microscope) after ion polishing was taken by using a field emission type scanning electron microscope (SU 8020 manufactured by Hitachi High-Technologies Corporation). Imaging conditions of an acceleration voltage of 5 kV and magnification ratios of 5000 times and 10000 times were set.

Figure 7:
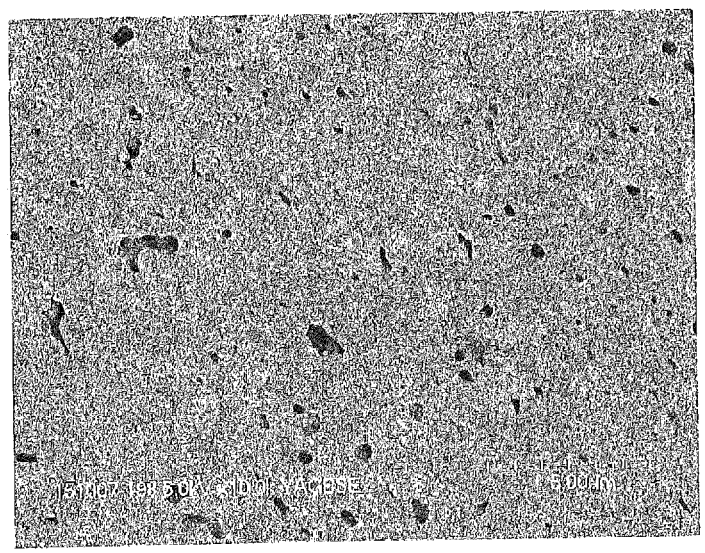
FIG. 7 shows a cross-sectional photograph (center portion) of a heat-joining sheet according to Example 3.
Figure 8:
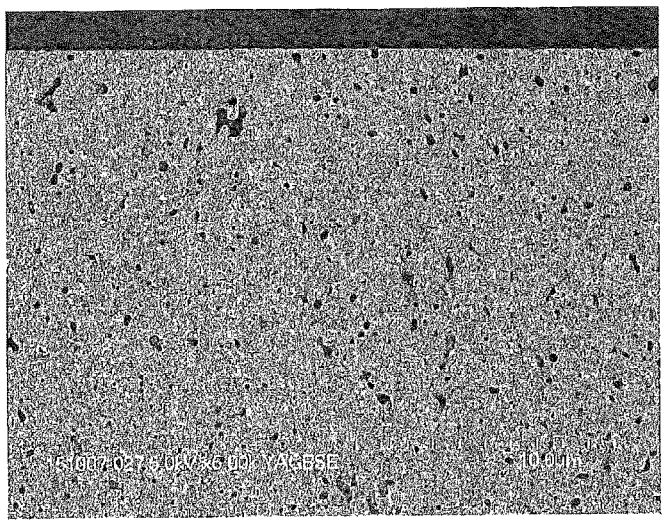
FIG. 8 shows a cross-sectional photograph of the heat-joining sheet according to Example 3 (the vicinity of the interface between the sheet and a chip).

FIGS. 7 and 8 are cross-sectional photographs of the heat-joining sheet according to Example 3. FIG. 7 is a cross-sectional photograph of the center portion of the heat-joining sheet, and FIG. 8 is a cross-sectional photograph in the vicinity of the interface between the chip and the heat-joining sheet. In FIG. 8, an upper black portion is the chip.

TABLE 1

|  |  | Example 1 | Example 2 | Example 3 | Example 4 | Example 5 | Example 6 | Example 7 | Comparative Example 1 | Comparative Example 2 |
|---|---|---|---|---|---|---|---|---|---|---|
|  | Pressure (MPa) | 40 | 40 | 10 | 10 | 5 | 5 | 10 | 10 | 2 |
| Temperature increasing step | Temperature increase starting temperature (° C.) | 120 | 20 | 80 | 20 | 120 | 20 | 80 | 150 | 150 |
|  | Time required for temperature increase (seconds) | 133 | 187 | 147 | 187 | 133 | 187 | 80 | 100 | 100 |
| Sintering step | Sintering temperature (° C.) | 300 | 300 | 300 | 300 | 300 | 300 | 200 | 300 | 300 |
|  | Sintering time (seconds) | 150 | 150 | 150 | 150 | 150 | 150 | 300 | 150 | 150 |
|  | Reliability evaluation | good | good | good | good | good | good | good | poor | poor |

[Observation of Cross Section]

SEM images of the cross sections of the evaluation samples in Example 3 and Example 7 were taken as described below.

First, each of the evaluation samples was embedded in an epoxy resin (cured resin manufactured by SCANDIA (2-pack type, SCANDIPLEX A, SCANDIPLEX B)).

<Embedding Conditions>
SCANDIPLEX A: SCANDIPLEX B=9:4 (volume ratio)
left at 45° C. for 1 to 2 hours After embedding, the diagonal cross-section of the silicon chip was exposed by a mechanical polishing method. In the mechanical polishing, rough polishing was performed, and precise polishing was then performed. As a polishing device for rough polishing, RotoPol-31 manufactured by Struers was used. As a polishing device for precise polishing, a precise polishing device MultiPrep manufactured by ALLIED was used. The rough polishing conditions and the precise polishing conditions were as follows.

<Rough Polishing Conditions>
a. Waterproof abrasive paper: SiC Foil #220 manufactured by Struers
b. Disk rotation number: 150 rpm As is clear from FIGS. 7 and 8, in Example 3, sintering proceeds in almost the entire range including the vicinity of the interface between the chip and the heat-joining sheet. Therefore, the heat-joining sheet is sufficiently joined to the chip.

Figure 9:
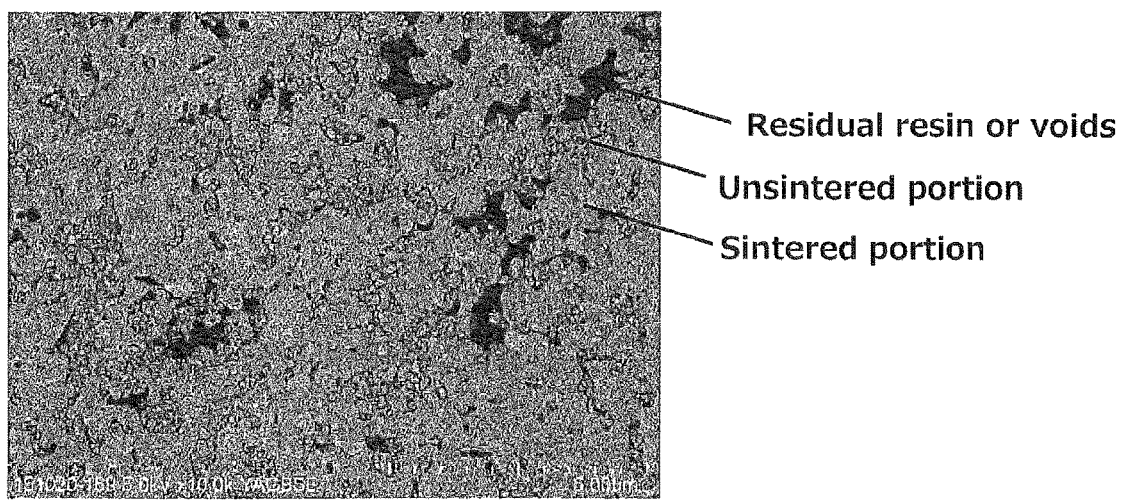
FIG. 9 shows a cross-sectional photograph (center portion) of a heat-joining sheet according to Example 7.
Figure 10:
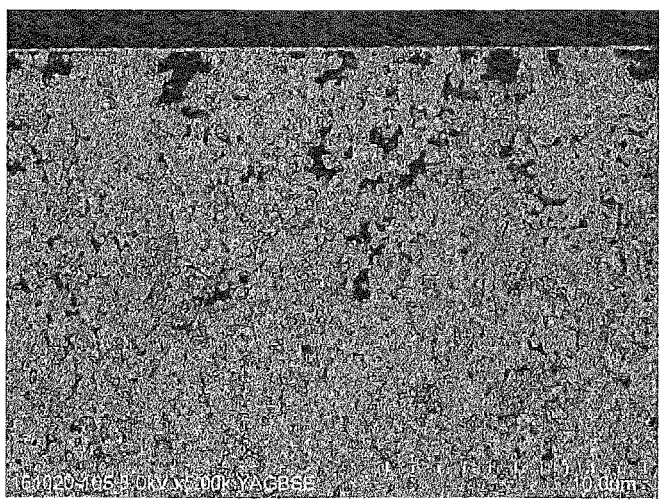
FIG. 10 shows a cross-sectional photograph of the heat-joining sheet according to Example 7 (the vicinity of the interface between the sheet and a chip).

FIGS. 9 and 10 are cross-sectional photographs of the heat-joining sheet according to Example 7. FIG. 9 is a cross-sectional photograph of the center portion of the heat-joining sheet, and FIG. 10 is a cross-sectional photograph in the vicinity of the interface between the chip and the heat-joining sheet. In FIG. 10, an upper black portion is the chip.

As is apparent from FIGS. 9 and 10, in Example 7, partial sinterable metal particles remain without being sintered, but the other sinterable metal particles are sintered at a certain level or more. Therefore, in Example 7, the heat-joining sheet is sufficiently joined to the chip.

DESCRIPTION OF REFERENCE SIGNS

10 Laminate
40 Heat-joining sheet
20 Semiconductor wafer

22 Semiconductor element
50 Substrate
40a, 40b Separator

The invention claimed is:

1. A joint manufacturing method comprising:
a step A of preparing a laminate in which two objects to be joined are temporarily adhered with a heat-joining sheet including a pre-sintering layer interposed between the two objects to be joined;
a step B of increasing a temperature of the laminate from a temperature equal to or lower than a first temperature defined below to a second temperature; and
a step C of holding the temperature of the laminate in a predetermined range after the step B,
wherein
the laminate is pressurized during at least a part of the step B and during at least a part of the step C:
the first temperature is a temperature at which an organic component contained in the pre-sintering layer is decreased by 10% by weight when the pre-sintering layer is subjected to thermogravimetric measurement; and
when the step B and the step C are performed in air, the thermogravimetric measurement is performed in the air, and when the step B and the step C are performed in a nitrogen atmosphere, a reducing gas atmosphere or a vacuum atmosphere, the thermogravimetric measurement is performed in the nitrogen atmosphere.

2. The joint manufacturing method according to claim 1, wherein the laminate is pressurized at 5 to 40 MPa.

3. The joint manufacturing method according to claim 1, wherein the temperature held in the step C is in a range of 200° C. to 400° C.

4. The joint manufacturing method according to claim 1, wherein the laminate is pressurized by a flip chip bonder or a parallel plate press.

* * * * *